United States Patent

Chen et al.

[11] Patent Number: 5,912,844
[45] Date of Patent: Jun. 15, 1999

[54] METHOD FOR FLASH EEPROM DATA WRITING

[75] Inventors: Chia-Shing Chen; Mam-Tsung Wang, both of Hsing Chu, Taiwan

[73] Assignee: Macronix International Co., Ltd., Taiwan

[21] Appl. No.: 09/015,606

[22] Filed: Jan. 28, 1998

[51] Int. Cl.$^6$ .................................................. G11C 16/04
[52] U.S. Cl. .............................. 365/185.28; 365/185.33
[58] Field of Search ......................... 365/185.28, 185.29, 365/185.01, 185.33, 184

[56] References Cited

U.S. PATENT DOCUMENTS

| | | | |
|---|---|---|---|
| 5,163,021 | 11/1992 | Mehrotra et al. | 365/185 |
| 5,172,338 | 12/1992 | Mehrotra et al. | 365/185 |
| 5,396,459 | 3/1995 | Arakawa | 365/185 |
| 5,396,468 | 3/1995 | Harari et al. | 365/218 |
| 5,412,793 | 5/1995 | Kreifels et al. | 395/425 |
| 5,418,752 | 5/1995 | Harari et al. | 365/218 |
| 5,535,158 | 7/1996 | Yamagata | 365/185.29 |
| 5,535,328 | 7/1996 | Harari et al. | 395/182.05 |

OTHER PUBLICATIONS

Kanamori, K. et al., "A New Source–Side Injection EPROM (SIEPROM) Cell For 3–V Only Flash Memory", Nonvolatile Semiconductor Memory Workshop, NEC Corporation, 1995, 2 pages.

Kaya, C. et al., "Buried Source–Side Injection (BSSI) for Flash EPROM Programming", IEEE Electron Device Letters, vol. 13, No. 9, Sep. 1992, pp. 465–467.

Haddad, S. et al., "An Investigation of Erase–Mode Dependent Hole Trapping in Flash EEPROM Memory Cell", IEEE Electron Device Letters, vol. 11, No. 11, Nov. 1990, pp. 514–516.

Aritome, S. et al., "Reliability Issues of Flash Memory Cells", Proceedings of the IEEE, vol. 81, No. 5, May 1993, pp. 776–788.

*Primary Examiner*—Do Hyun Yoo
*Assistant Examiner*—David Lam
*Attorney, Agent, or Firm*—Wilson Sonsini Goodrich & Rosati

[57] ABSTRACT

Method for writing data to a NOR-type flash memory array including loading page data to a bit-latch buffer, programming cells to low threshold voltage $V_t$, and programming cells to high $V_t$. Programming cells to high $V_t$ by either: Channel Hot Electron Injection (CHEI) or Source Side Injection (SSI). CHEI releases the band-to-band induced hot hole damage while SSI further reduces the sector size to be the same as page size for NOR-type flash EEPROM memory.

20 Claims, 4 Drawing Sheets

| | New | FLASH EEPROM | FLASH EPROM |
|---|---|---|---|
| Program | Drain Edge F-N/ Channel Hot Electron | Drain Edge F-N | Hot Channel Electron |
| Program Vt Shift | High --> Low/ Low --> High | High --> Low | Low --> High |
| Program Verification | by bit | by bit | by bit |
| Program Disturb | Drain Disturb Dominant @CHE Program | Drain Disturb Dominant @F-N Program | Drain Disturb Dominant @CHE Program |
| Erase | not needed | Channel F-N | Source Edge F-N |
| Erase Vt Shift | X | Low --> High | High --> Low |
| Erase Verification | X | by Sector/Chip | by Sector/Chip |
| Erase Issue | X | No | Erased Vt Distribution Control/Pre-Program Needed |
| Program Voltage | Low Drain/High Negative Gate Bias @F-N to reduce hot hole injection | Drain/Gate Voltage has to be compromised between disturb | High Source/ Medium Negative Gate Bias @F-N |
| Sector Size | small (ex. 4K bits) if source disturb @CHE Program are reduced | large (1M bits) | medium (64K bits) |
| WL Decoder Number | no reduction | reduced by 8 | reduced by 4 |
| Page Bit Latch | needed | needed | not needed |

*FIG. 2*

|  | Source Edge CHE | Source Side Injection |
| --- | --- | --- |
| VD | GND | + VD ($\approx$ 3V) |
| VS | + VS ($\approx$ 6 V) | GND |
| VG | + VG | + VG |
| ID@Program | $\approx$ 300μA/cell | $\approx$ 40μA/cell |
| Program Speed | 10 μs | 10 μs |
| IG/ID | $1 \times 10^{-6}$ | $1 \times 10^{-5}$ |
| Program Disturb | by VS = 6 V | by VD = 3 V |
| Read Disturb | Low | High |

FIG. 3

METHOD FOR FLASH EEPROM DATA WRITING

BACKGROUND OF THE INVENTION

1. Field of the Invention

The present invention relates to the field of semiconductor electrically programmable and electrically erasable read-only memories (EEPROMs) and to electrically programmable read-only memories (EPROMs) having floating gates, and more particularly to a new method for multi-level cell writing.

2. Description of Related Art

The most commonly used EPROM cell has an electrically floating gate which is surrounded by insulation and generally disposed between a source and drain region formed in a silicon substrate. In earlier versions of these cells, charge is injected through the insulation by avalanche injection. Later versions of EPROMs relied on channel injection for charging the floating gate. These EPROMs are erased by exposing the array to ultraviolet radiation.

Electrically erasable EPROMs (EEPROMs) are also very common. In some cases, charge is placed into and removed from a floating gate by tunneling the charge through a thin oxide region formed on the substrate. In the other instances, charge is removed through an upper electrode.

Another type of common EPROM/EEPROM is referred to as Flash EPROM or Flash EEPROM. In these flash memories, the entire array is simultaneously erased, electrically.

FLASH EPROM: The structure of this device is the same as that of traditional ultraviolet erasure-type EPROM. Programming can be performed by hot electron injection from the channel. The cell is programmed to a high cell threshold voltage, $V_t$, by means of channel hot electron injection, with the control gate and the drain connected to a high voltage. Erasing the cell to a low threshold state is performed by Fowler-Nordheim tunneling of electrons from the floating gate to the source diffusion layer by grounding or applying a negative voltage to the control gate and applying a high voltage to the source diffusion.

FLASH EEPROM: In contrast to the Flash EPROM devices, these devices use drain edge Fowler-Nordheim tunneling to erase to a low cell threshold voltage, $V_t$, by page with bit verification basis and use channel Fowler-Nordheim tunneling erase to a high cell threshold voltage, $V_t$, by sector verification basis.

The first one of these two types suffers from erased-$V_t$ distribution control.

Electrical erase is not self-limiting. Therefore, electrical erase can leave the floating gate positively charged, thus turning the memory transistor into a depletion-mode transistor; this is called over-erasing.

A soft program is used to recover a limited number of over-erased bits and pre-programing is needed to avoid over-erasing of those bits subjected to erasure during program/erase cycle.

The second one of these two types of NOR flash memories, which controls the low cell $V_t$ distribution by bit-by-bit verification with a page bit-latch system, suffers from high band-to-band tunneling induced hot-hole damage, which causes data retention, as to keep the program speed compatible with hot-channel-electron programming system. Holes can be generated through surface-field-induced band-to-band tunneling in the source-to-gate overlap region. These holes first travel parallel to the substrate interface and then flow to the substrate. However, a significant number of these holes become energetic while traveling in the depletion region. These hot holes can surmount the Si/SiO2 barrier and inject into the oxide. This situation is most frequently encountered in the electrical erase operation of the flash memory cell.

Hot hole injection during flash erase has been identified as a major concern for cell performance and reliability. Hot hole injection could cause variation in the erased cell $V_t$ in the memory array as well as the generation of surface states in the cell channel region.

Moreover, these two systems mentioned above have high sector size, which may seriously limit their application domain and deteriorate the endurance of flash EEPROM cells because of multiple program/erase cycles for minor data changes in the same sector.

Another problem associated with floating gate memory devices arises because the charging and discharging of the floating gates is difficult to control over a large array of cells. Thus, some of the cells program or erase more quickly than others in the same device. In a given program or erase operation, not all the cells subject of the operation will settle with the same amount of charge stored in the floating gate. Thus, so-called program verify and erase verify sequences have been developed to efficiently ensure that the memory is being accurately programmed and erased. The program and erase verify operations are based on comparing the data stored in the floating gate memory array with the intended data. The process of comparing data is relatively time consuming, involving sequencing byte by byte through the programmed or erased cells. If a failure is detected in the verify sequence, then the program or erase operation is retried. Program retries are typically executed word-by-word or byte-by-byte in prior art devices. Thus, bits successfully programmed in a byte with one failed bit are subject to the program cycle repeatedly. This can result in over-programming and failure of the cell.

To improve the efficiency of program and program verify operations, so-called page mode flash devices have been developed. In these devices, a page buffer is associated with the memory array. The page buffer includes a set of bit latches, one bit latch associated with each global bitline in the array. To program a page in the array, the page buffer is loaded with the data to be programmed, by transferring byte by byte the program data into the bit latches of the page buffer. The program operation is then executed in parallel on a bitline by bitline basis controlled by the contents of the bit latches. The verify procedure is based on clearing automatically all of the bit latches in the page buffer which are successfully programmed in a parallel operation. The page buffer is then read byte-by-byte to confirm that all bits have been cleared, indicating a successful program operation.

Some types of floating gate memory program or erase operations involve applying a high voltage to the bitlines.

An improved page buffer that operates with low current bit latches, and is capable of supporting program, program verify, read and erase verify processes in a page mode is desirable. Also, it is desirable that the page buffer be useful for applying high voltage pulses to bitlines based on the contents of the page buffer.

SUMMARY OF THE INVENTION

These and additional objects are accomplished by the various aspects of the present invention, wherein, the page bit-latch system is used to control the low cell threshold voltage, $V_t$, distribution during drain edge Flower-Nordheim programming while high cell $V_t$ programming is done by channel hot electron injection (CHEI) or source-side injection (SSI).

Another aspect of the present invention is erasing the cells of the page to raise $V_t$ from 0V to avoid too low a $V_t$ before data writing. This can also be done by CHEI or SSI.

According to another aspect of the invention, a buffer memory is coupled to the plurality of bitlines, and the logic that senses the states of the bit latches includes circuitry for transferring the data indicating the states of the bit latches to the buffer memory. This circuitry includes accumulation logic that accumulates the state of each bit latch over the sequence and stores the result in the buffer memory.

According to another aspect of the invention, the integrated circuit includes program logic to control the wordline voltage source in the plurality of bit latches to program a set of memory cells connected to a selected wordline.

An object of the present invention to provide an EEPROM array with reduced band-to-band tunneling induced hot hole damage.

Further, it is an object of the present invention to provide a method to increase the application domain and the endurance of the product.

Another object of the present invention is to provide an improved page buffer which operates with bit latches and is capable of supporting program, program verify, and read and erase verify processes in a page mode.

It is yet another object of the present invention to provide a page buffer that can be useful for applying high voltage pulses to bitlines based on the contents of the page buffer.

Another object of the present invention is to provide techniques for increasing the number of program/erase cycles that a flash EEPROM can endure.

It is yet another object of the present invention to provide flash EEPROM semiconductor chips that are useful for solid state memory to replace magnetic disk storage devices.

It is also another aspect of the present invention to reduced the high/low $V_t$ cell program disturb so that the sector size of the embodiments can be reduced to page size without suffering disturb issue for long cycle endurance product.

Additional objects, features, and advantages of the present invention will be understood from the following description.

BRIEF DESCRIPTION OF THE DRAWINGS

FIG. 2 illustrates a comparison between the data writing algorithm according to this present invention and prior art flash EEPROM/EPROM algorithms.

FIG. 3 is a table which illustrates a comparison between source edge channel hot electron injection (CHEI) and source side injection (SSI).

DETAILED DESCRIPTION

Figure 1A:
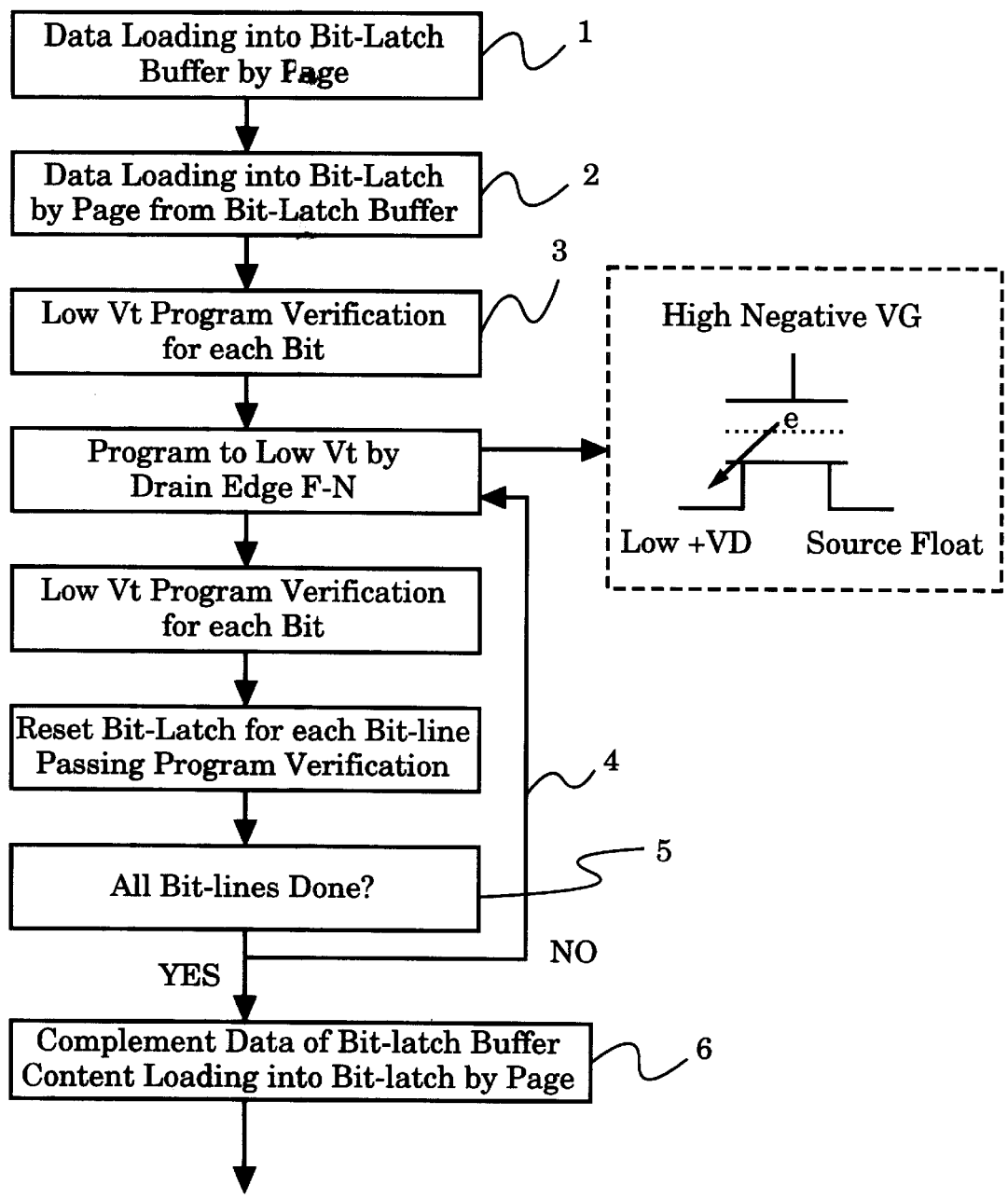
FIGS. 1A and 1B illustrate a flow chart of the data writing algorithm for flash EEPROM according to the present invention.

This invention involves a flash EEPROM system. The page bit-latch system is used to control the low cell $V_t$ distribution during drain edge F-N programming, while high cell $V_t$ programming is done by CHEI (see embodiment 1 as described below) or SSI (see embodiment 2 as described below), instead of channel F-N erase methods used in prior art flash EEPROM.

The page bit-latch system includes program logic to control the wordline voltage source in the plurality of bit latches to program a set of memory cells connected to a selected wordline. The control logic executes a plurality of program cycles including following:

a first threshold cycle to set bit latches in the plurality of bit latches to a "program" state for memory cells coupled to the corresponding bitlines to be programmed to a first threshold voltage and to a "do not program" state for memory cells coupled to the corresponding bitlines to be left in an erased state, to execute a program cycle including applying a program potential to bitlines coupled to bit latches loaded with the "program state", applying a first wordline voltage to the selected wordline, wherein the first wordline voltage corresponds to the first threshold voltage, and setting the state of the plurality of bit latches to the "do not program" state after applying the first wordline voltage to indicate whether the first threshold voltage has been successfully programmed, and logic to retry the program cycle until all bit latches in the plurality of bit latches are set to the "do not program" state or until an error condition is encountered;

a second threshold cycle to set bit latches in the plurality of bit latches to the "program" state for memory cells coupled to the corresponding bitlines to be programmed to a second threshold voltage and to a "do not program" state for memory cells coupled to the corresponding bitlines to be left in an erased state or left programmed to the first threshold voltage, to execute a program cycle including applying a program potential to bitlines coupled to bit latches loaded with the "program" state, applying a second wordline voltage to the selected wordline, wherein the second wordline voltage corresponds to the second threshold voltage, and setting the state of the plurality of bit latches to the "do not program" state after applying the second wordline voltage to indicate whether the second threshold voltage has been successfully programmed, and logic to retry the program cycle until all bit latches in the plurality of bit latches are set to the "do not program" state or until an error condition is encountered; and a third threshold cycle to set bit latches in the plurality of bit latches to the "program" state for memory cells coupled to the corresponding bitlines to be programmed to a third threshold voltage and to a "do not program" state for memory cells coupled to the corresponding bitlines to be left in an erased state, left programmed to the first threshold voltage, or left programmed to the second threshold voltage, to execute a program cycle including applying a program potential to bitlines coupled to bit latches loaded with the "program" state, applying a third wordline voltage to the selected wordline, wherein the third wordline voltage corresponds to the third threshold voltage, and setting the state of the plurality of bit latches to the "do not program" state after applying the third wordline voltage to indicate whether the third threshold voltage has been successfully programmed, and logic to retry the program cycle until all bit latches in the plurality of bit latches are set to the "do not program" state or until an error condition is encountered.

The cells of the page have to be erased to raise $V_t$ from 0V to avoid too low a $V_t$ before data writing. This can be done by CHEI (embodiment 1) or SSI (embodiment 2). Since the bit number is limited, the power supply can sustain.

Figure 1B:
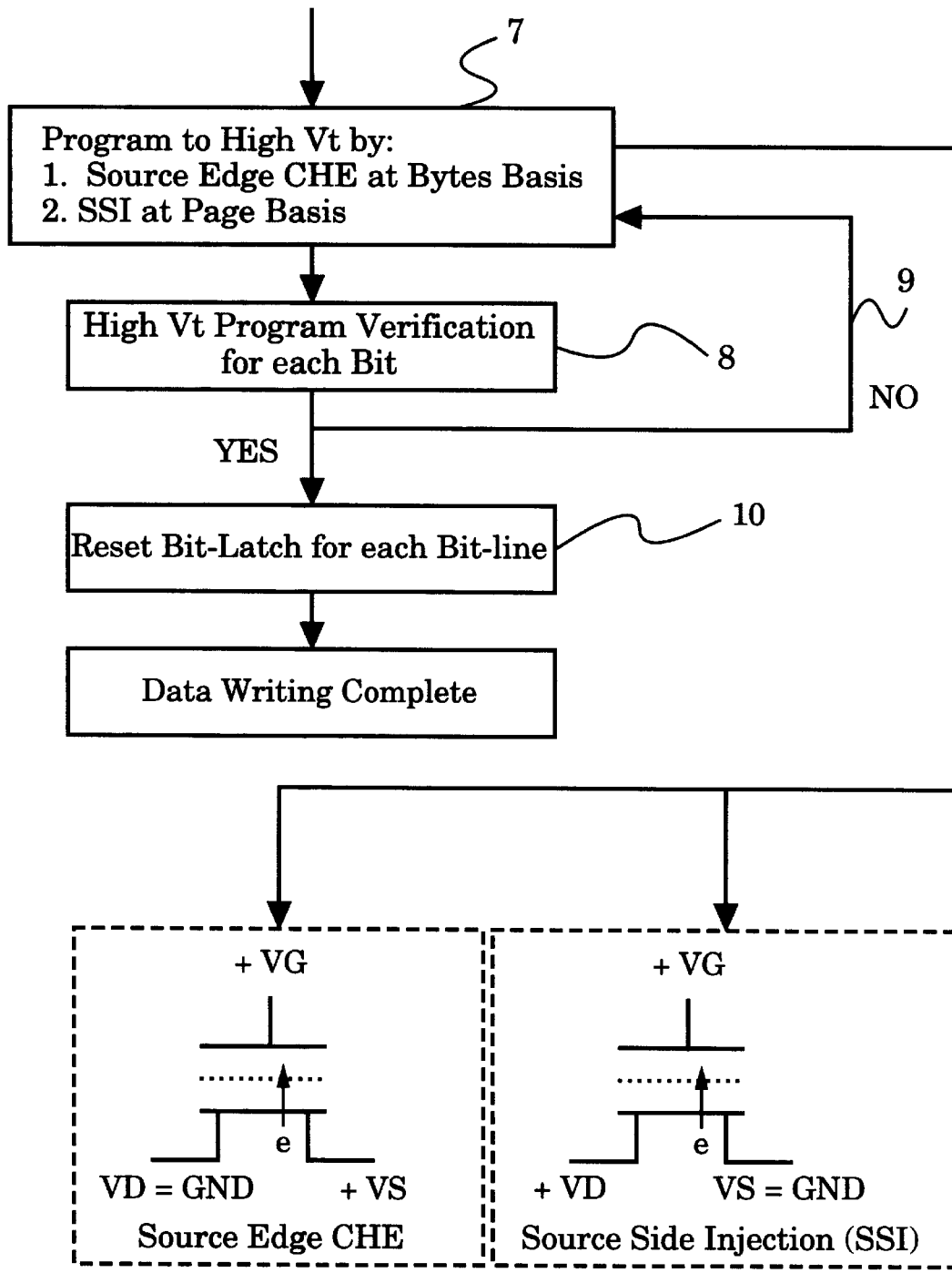

A flow chart of the data writing algorithm is shown in FIG. 1. The following is a description of the data writing algorithm.

1. External page data are loaded into a bit-latch buffer, instead of into bit-latch directly. The use of this buffer is to keep the data needed later for high $V_t$ programing.

To program cells to low $V_t$:

2. The to-be-programmed-low-cell bitline latches are set by data load from the bit-latch buffer.

3. Low $V_t$ cells are low-$V_t$-verified bit-by-bit. If a bit is verified, the related bit-latch of each cell is reset. This will avoid programming the low $V_t$ cell again causing negative $V_t$, which is undesirable for NOR-type flash EEPROM memory.

4. If not program-verified, program pulses are delivered to bitline/wordline.

5. Repeat steps 3 and 4 until all the low $V_t$ cells in this page are low-$V_t$-verified.

To program cells to high $V_t$:

(A) Embodiment 1:

6. Complement byte data of the bit-latch buffer are loaded into bit-latches.

7. Perform the high $V_t$ programming by source edge CHEI. Because of the high current loading, program action byte-by-byte.

8. High $V_t$ cells are high-$V_t$-verified by bit-by-bit basis. If a bit is verified, the related bit-latch of each cell is reset.

9. If not high-$V_t$-verified, programming pulses are delivered to bitline/wordline.

10. Repeat 8 and 9 until all the high $V_t$ cells in this byte are high-$V_t$-verified.

11. Repeat 6–10 until all the bytes in the page are done.

(B) Embodiment 2:

6. Complement page data of the bit-latch buffer are loaded into bit-latches.

7. Perform the high $V_t$ programming by source side injection (SSI). Because of the small current loading, the program action is performed with page by page.

8. High $V_t$ cells are high-$V_t$-verified bit-by-bit. If a bit is verified, the related bit-latch of each cell is reset.

9. If a bit is not high-$V_t$-verified, program pulses are delivered to bitlines/wordlines.

10. Repeat 8 and 9 until all the high $V_t$ cells in this page are high-$V_t$-verified.

From the above, it can be seen that one of the features of this invention is that the high cell $V_t$ is programmed after the drain-edge F-N that allows the high negative word-line voltage to be applied during low-cell-$V_t$ programming since no negative gate disturb is of concern here and, therefore, the bitline voltage can be reduced correspondingly. The reduction of bitline voltage is believed to increase cell data retention capability. The comparison between this invention and prior art flash EPROM/flash EEPROM is shown in FIG. 2.

To reduce the sector size of NOR-type flash EEPROM, the high/low $V_t$ cell programming disturb has to be reduced. Since the word-line disturb is not an issue for CHEI programming and is not a concern for drain edge F-N programming in this invention, the only concern is the source disturb in embodiment 1 or the drain disturbing in embodiment 2 during high $V_t$ programming. In embodiment 1, the source voltage is about 6V. The drain disturbing failure time is about 1s for $V_{cc}$=5 V system. The maximum cycle number in a 64 WL memory array will be about 1 s/100 $\mu$s worst CHEI programming time/(64-1)WL source disturbing=160. This is not enough for 100 k cycle criterion. The embodiment 2 using the source side injection at low drain voltage (~3V) has much less drain disturb $V_t$ shift than source-edge CHEI does. A comparison between source-edge CHEI and source side injection is shown in FIG. 3. In a rough estimate, the drain disturb for SSI is decreased by 4 orders as the condition listed there as compared to source edge CHEI. That is, embodiment 2 can sustain up to a 160*10000=1.6M cycle drain disturb. To assure the order correctness of the drain disturb margin, comparison is made between prior art flash EEPROM and embodiment 2. Taking into count the program time difference between flash EEPROM cell (~1 ms@VD=6V) and SSI(~10 $\mu$s), the overall drain disturb for SSI is reduced by 6 orders in time unit from the prior art flash EEPROM. Since the drain disturb is not an issue in prior art flash EEPROM memory, embodiment 2 can sustain up to 1M cycle drain disturb. This is the same order as what is derived from drain disturb failure time. Therefore, the sector size of the embodiment can be reduced to page size without suffering disturb for a 100 k cycle endurance product.

While the embodiments of this invention that have been described are the preferred implementations, those skilled in the art will understand that variations thereof may also be possible. Therefore, the invention is entitled to protection within the full scope of the appended claims.

What is claimed is:

1. A method for writing data to a flash memory array, the method comprising:
    a) loading external page data into a bit-latch buffer;
    b) setting to-be-programmed-low-cell bitline latches by data load from the bit-latch buffer;
    c) low-$V_t$-verifying low $V_t$ cells bit-by-bit;
    d) if a bit is verified, resetting the related bit-latch of each cell;
    e) if a bit is not verified, delivering program pulses to a respective bitline and wordlines;
    f) repeating steps c), d), and e) until all the low $V_t$ cells in this page are low-$V_t$-verified or a retry limit is reached;
    g) loading complement byte data of the bit-latch buffer into bit latches;
    h) programming high $V_t$ by source edge channel hot electron injection (CHEI);
    i) high-$V_t$-verifying high $V_t$ cells bit-by-bit;
    j) if a bit is verified, resetting the related bit-latch of each cell;
    k) if a bit is not verified, delivering program pulses to a respective bitline and wordlines;
    l) repeating steps i), j), and k) until all the high $V_t$ cells in this byte are high-$V_t$-verified or a retry limit is reached.

2. The method of claim 1, wherein the bit-latch buffer is coupled to corresponding bitlines and has a first state and second state, and includes circuits to change bit latch from one state to another state in response to signals on the corresponding bitlines generated in response to a wordline voltage on a selected wordline being one of greater than or equal to, or less than or equal to, the threshold voltage level of a memory cell connected to the selected wordline and to the corresponding bitline.

3. The method of claim 1, including:
    using program logic to control the wordline voltage source in the plurality of bit latches to program a set of memory cells connected to a selected wordline, including using control logic which executes
    a first threshold cycle to set bit latches in the plurality of bit latches to a program state for memory cells coupled to the corresponding bitlines to be programmed to a first threshold voltage and to a do not program state for memory cells coupled to the corresponding bitlines to be left in an erased state, to execute a program cycle including applying a program potential to bitlines coupled to bit latches loaded with the program state, applying a first wordline voltage to the selected wordline, wherein the first wordline voltage corresponds to the first threshold voltage, and setting the state of the plurality of bit latches to the do not program state after applying the first wordline voltage to indicate whether the first threshold voltage has been successfully programmed, and logic to retry the program cycle until all bit latches in the plurality of bit latches are set to the do not program state or until an error condition is encountered; and a second threshold cycle to set bit latches in the plurality of bit latches to the program state for memory cells coupled to the corresponding bitlines to be programmed to a second threshold voltage and to a do not program state for memory cells coupled to the corresponding bitlines to be left in an erased state or left programmed to the first threshold voltage, to execute a program cycle including applying a program potential to bitlines coupled to bit latches loaded with the program state, applying a second wordline voltage to the selected wordline, wherein the second wordline voltage corresponds to the second threshold voltage, and setting the state of the plurality of bit latches to the do not program state after applying the second wordline voltage to indicate whether the second threshold voltage has been successfully programmed, and logic to retry the program cycle until all bit latches in the plurality of bit latches are set to the do not program state or until an error condition is encountered.

4. The method of claim 3, wherein the control logic further executes:

a third threshold cycle to set bit latches in the plurality of bit latches to a program state for memory cells coupled to the corresponding bitlines to be programmed to a third threshold voltage and to a do not program state for memory cells coupled to the corresponding bitlines to be left in an erased state, left programmed to the first threshold voltage, or left programmed to the second threshold voltage, to execute a program cycle including applying a program potential to bitlines coupled to bit latches loaded with the program state, applying a third wordline voltage to the selected wordline, wherein the third wordline voltage corresponds to the third threshold voltage, and setting the state of the plurality of bit latches to the do not program state after applying the third wordline voltage to indicate whether the third threshold voltage has been successfully programmed, and logic to retry the program cycle until all bit latches in the plurality of bit latches are set to the do not program state or until an error condition is encountered.

5. The method of claim 3, wherein the error condition includes exceeding a maximum number of retries.

6. The method of claim 3, wherein the program cycle includes applying a negative potential to the selected wordlines.

7. The method of claim 3, wherein memory cells in the erased state have a threshold level higher than the first threshold level and second threshold level.

8. The method of claim 1, wherein the bit-latch buffer in step a) is used to keep the data needed later for high $V_t$ program.

9. The method of claim 1, wherein the resetting of low $V_t$ cells in step d) is used to avoid the low $V_t$ cells to be programmed again as to have negative $V_t$.

10. The method of claim 1, wherein the program action in step h) is by byte-by-byte basis.

11. A method for writing data to flash memory array, comprising the steps of:

a) loading external page data into a bit-latch buffer;

b) setting to-be-programmed-low-cell bitline latches by data load from the bit-latch buffer;

c) low-$V_t$-verifying low $V_t$ cells by bit-by-bit;

d) if a bit is verified, resetting the related bit-latch of each cell;

e) if a bit is not verified, delivering program pulses to a respective bitline and wordlines f) repeating steps c), d), and e) until all the low $V_t$ cells in this page are low-$V_t$-verified or a retry limit is reached;

g) loading complement byte data of the bit-latch buffer into bit-latches;

h) programming high $V_t$ by source side injection (SSI);

i) high-$V_t$-verifying high $V_t$ cells bit-by-bit;

j) if a bit is verified, resetting the related bit-latch of each cell;

k) if a bit is not verified, delivering program pulses to a respective bitline and word-line;

l) repeating steps i), j), and k) until all the high $V_t$ cells in this page are high-$V_t$-verified or a retry limit is reached.

12. The method of claim 11, wherein the bit-latch buffer is coupled to corresponding bitlines and has a first state and second state, and includes circuits to change bit latch from one state to another state in response to signals on the corresponding bitlines generated in response to a wordline voltage on a selected wordline being one of greater than or equal to, or less than or equal to, the threshold voltage level of a memory cell connected to the selected wordline and to the corresponding bitline.

13. The method of claim 11, including:

using program logic to control the wordline voltage source in the plurality of bit latches to program a set of memory cells connected to a selected wordline, including using control logic which executes a first threshold cycle to set bit latches in the plurality of bit latches to a program state for memory cells coupled to the corresponding bitlines to be programmed to a first threshold voltage and to a do not program state for memory cells coupled to the corresponding bitlines to be left in an erased state, to execute a program cycle including applying a program potential to bitlines coupled to bit latches loaded with the program state, applying a first wordline voltage to the selected wordline, wherein the first wordline voltage corresponds to the first threshold voltage, and setting the state of the plurality of bit latches to the do not program state after applying the first wordline voltage to indicate whether the first threshold voltage has been successfully programmed, and logic to retry the program cycle until all bit latches in the plurality of bit latches are set to the do not program state or until an error condition is encountered; and a second threshold cycle to set bit latches in the plurality of bit latches to the program state for memory cells coupled to the corresponding bitlines to be programmed to a second threshold voltage and to a do not program state for memory cells coupled to the corresponding bitlines to be left in an erased state or left programmed to the first threshold voltage, to execute a program cycle including applying a program potential to bitlines coupled to bit latches loaded with the program state, applying a second wordline voltage to the selected wordline, wherein the second wordline voltage corresponds to the second threshold voltage, and setting the state of the plurality of bit latches to the do not program state after applying the second wordline voltage to indicate whether the second threshold voltage has been successfully programmed, and logic to retry the program cycle until all bit latches in the plurality of bit latches are set to the do not program state or until an error condition is encountered.

14. The method of claim 13, wherein the error condition includes exceeding a maximum number of retries.

15. The method of claim 13, wherein the program cycle includes applying a negative potential to the selected wordlines.

16. The method of claim 13, wherein memory cells in the erased state have a threshold level higher than the first threshold level and second threshold level.

17. The method of claim 11, wherein the control logic further executes:

a third threshold cycle to set bit latches in the plurality of bit latches to the program state for memory cells coupled to the corresponding bitlines to be programmed to a third threshold voltage and to a do not program state for memory cells coupled to the corresponding bitlines to be left in an erased state, left programmed to the first threshold voltage, or left programmed to the second threshold voltage, to execute a program cycle including applying a program potential to bitlines coupled to bit latches loaded with the program state, applying a third wordline voltage to the selected wordline, wherein the third wordline voltage corresponds to the third threshold voltage, and setting the state of the plurality of bit latches to the do not program state after applying the third wordline voltage to indicate whether the third threshold voltage has been successfully programmed, and logic to retry the program cycle until all bit latches in the plurality of bit latches are set to the do not program state or until an error condition is encountered.

18. The method of claim 11, wherein the bit-latch buffer in step a) is used to keep the data needed later for high $V_t$ program.

19. The method of claim 11, wherein the resetting of low $V_t$ cells in step d) is used to avoid the low $V_t$ cells to be programmed again as to have negative $V_t$.

20. The method of claim 11, wherein the program action in step h) is done only with page basis.

* * * * *